(12) United States Patent
Shih et al.

(10) Patent No.: US 7,993,035 B2
(45) Date of Patent: *Aug. 9, 2011

(54) ASPHERICAL LED ANGULAR LENS FOR NARROW DISTRIBUTION PATTERNS AND LED ASSEMBLY USING THE SAME

(75) Inventors: Bo-Yuan Shih, Taipei (TW); Kai Mou Lin, Taipei (TW); Yi-Fan Liao, Taipei (TW); San-Woei Shyu, Taipei (TW)

(73) Assignee: E-Pin Optical Industry Co., Ltd., Taipei (TW)

( * ) Notice: Subject to any disclaimer, the term of this patent is extended or adjusted under 35 U.S.C. 154(b) by 248 days.

This patent is subject to a terminal disclaimer.

(21) Appl. No.: 12/491,062

(22) Filed: Jun. 24, 2009

(65) Prior Publication Data

US 2010/0014295 A1    Jan. 21, 2010

(30) Foreign Application Priority Data

Jun. 30, 2008   (TW) ............................... 97124648 A

(51) Int. Cl.
*F21V 3/00*       (2006.01)
*F21V 5/00*       (2006.01)

(52) U.S. Cl. ..................... 362/311.02; 362/335; 362/800

(58) Field of Classification Search ............. 362/311.02, 362/335, 800
See application file for complete search history.

(56) References Cited

U.S. PATENT DOCUMENTS

| | | | |
|---|---|---|---|
| 7,344,902 B2 | 3/2008 | Basin et al. | |
| 7,345,416 B2 | 3/2008 | Erchak | |
| 7,352,011 B2 | 4/2008 | Smits et al. | |
| 2005/0162854 A1 | 7/2005 | Finch | |
| 2006/0076568 A1 | 4/2006 | Keller et al. | |
| 2006/0105485 A1 | 5/2006 | Basin et al. | |
| 2006/0187653 A1 | 8/2006 | Olsson | |
| 2007/0114551 A1 | 5/2007 | Kawaguchi et al. | |
| 2007/0152231 A1 | 7/2007 | Destain | |

FOREIGN PATENT DOCUMENTS

| | | |
|---|---|---|
| CN | 200710118965.0 | 6/2007 |
| CN | 101013193 | 8/2007 |
| ES | 2157829 | 8/2001 |
| JP | 60007425 | 1/1985 |
| JP | 3032069 | 2/1991 |
| JP | 2002111068 | 4/2002 |
| JP | 2002221658 | 8/2002 |
| JP | 2004356512 | 12/2004 |
| JP | 2005203499 | 7/2005 |
| JP | 2005229082 | 8/2005 |
| JP | 2006072874 | 3/2006 |
| JP | 2007115708 | 5/2007 |
| JP | 2007140524 | 6/2007 |
| TW | M332796 | 5/2008 |
| WO | 2007100837 | 9/2007 |

*Primary Examiner* — Jason Moon Han
(74) *Attorney, Agent, or Firm* — WPAT, P.C.; Anthony King

(57) ABSTRACT

The present invention discloses an aspherical LED angular optical lens for narrow distribution patterns and an LED assembly using the same. The optical lens comprises a concave surface on a source side and a convex surface on a project side. The LED assembly comprising the optical lens can accumulate light emitted from the LED die and generate a peak intensity of the narrow angular circle distribution pattern which is greater than 15° and smaller than 30°. The present invention only uses a single optical lens capable of accumulating light and forming a required distribution pattern to satisfy the requirement of a luminous flux ratio greater than 85% and the requirement of an illumination, a flash light of a cell phone or a flash light of a camera.

6 Claims, 9 Drawing Sheets

ASPHERICAL LED ANGULAR LENS FOR NARROW DISTRIBUTION PATTERNS AND LED ASSEMBLY USING THE SAME

BACKGROUND OF THE INVENTION

1. Field of the Invention

The present invention relates to an aspherical LED angular lens for narrow distribution patterns and its LED assembly, and more particularly to an optical lens applied to an LED light emitting source to produce patterns and an LED assembly composed of the optical lens and applied for LED illumination, and a flash light of a cell phone or a camera.

2. Description of the Related Art

Light emitting diode (LED) has many advantages such as low voltage, low power consumption and long life, and thus it has been used extensively in the areas of indicators and illuminators. Since LED features a simple color light, a mini flat package, LED is commonly used as a flash light of a cell phone or a camera. However, the light source emitted from an LED die is not a point light source, and its brightness is non-uniform. Many researchers in the light collection related field have conducted extensive researches on reducing the size of an LED die, improving the light emission efficiency, and using an optical lens, which are the trends of the related technological development.

The design of LED optical lens can be divided into a primary optical lens and a secondary optical lens, and the primary optical lens is a lens packaged directly on an LED die and generally used for concentrating light, and the secondary optical lens is used in an LED or an LED array primarily used for scattering a light beam. In the designs of conventional primary optical lenses including a symmetrical aspherical lens used in ES2157829, a spherical lens used in Japan Pat. Nos. JP3032069, JP2002-111068 and JP2005-203499, U.S. Pat. No. US2006/187653 and China Pat. No. CN101013193, and a spherical lens used in a bulky LED and disclosed by JP2002-221658. The primary optical lens produces a specific distribution pattern such as a large-angle, a small-angle, a circular or an elliptical pattern at an uniform peak intensity for advanced applications and structures of a LED array to give an optimal optical effect, in addition to the concentrating of light. In an application of the primary optical lens as shown in FIG. 1, a lens 23 is covered onto an LED die 21, and a silicon gel is filled between the lens 23 and the LED die 21, and the LED die 21 is a die that emits a blue light, and the silicon gel contains yellow phosphors. When the LED die 21 emits the blue light, the blue light goes through the silicon gel and becomes a white light by wavelength conversion. After the lens 23 concentrates the emitted light, the primary optical lens as disclosed in Japan Pat. Nos. JP2004-356512, JP2005-229082, JP2006-072874, JP2007-140524 and JP2007-115708, U.S. Pat. Nos. US2005/162854, US2006/105485, US2006/076568, US2007/114551, US2007/152231, U.S. Pat. Nos. 7,344,902, 7,345,416, and 7,352,011 and TW Pat. No. M332796 adopt the optical lens to produce a distribution pattern; Japan Pat. No. JP60007425, WIPO Pat. No. WO/2007/100837 produces an elliptical distribution pattern; or China Pat. No. 200710118965.0 produces a rectangular, square or bar-shaped pattern smaller than 160°.

As science and technology advance, electronic products tend to be developed with a light, thin, short and small design and a multiple of functions, and electronic products including digital still cameras, PC cameras, network cameras and cell phones have a camera lens, or even personal digital assistants (PDA) have installed a lens, and an LED flash light or an LED lamp for illuminations for the products of this sort is composed of one or more LED assemblies to form an array. To facilitate the portability and comply with the user-friendly requirement, the LED flash light or the LED lamp for illuminations not only conforms with the luminous flux, but also works together with LED assemblies in different distribution patterns, while achieving a smaller volume and a lower cost. For the requirements of a primary optical lens of an LED, the manufacture of a conventional primary optical lens with a complicated optical surface or an optical lens with a diffractive surface has the drawbacks of a high difficulty of the manufacture, an easy deformation of plastic injection molding, a difficult molding of glass and a high cost. Therefore, users require a design and an assembly of an easy-to-manufacture LED lens with a simple optical surface, such that a narrow angular circle distribution pattern can be formed by concentrating light by the LED and a peak intensity can be greater than 15° and smaller than 30°, and the luminous flux ratio can be greater than 85%.

SUMMARY OF THE INVENTION

It is a primary objective of the present invention to overcome the shortcomings of the prior art by providing an aspherical LED angular lens which is applied in an LED assembly for narrow distribution patterns. The LED assembly emits light from an LED die, and the optical lens is provided for concentrating light and forming a narrow angular circle distribution pattern greater than 15° and smaller than 30° by uniform peak intensity. A seal gel is filled between the optical lens and the LED. The optical lens is a lens having a concave surface and a convex surface and made of optical material, and the concave surface is an optical surface facing the source side of a light source, and the convex surface is an optical surface facing the project side of the light source, and at least one optical surface is aspherical, and the optical lens satisfies the following conditions:

$$0.7 \leq \left| \frac{R_1 - R_2}{R_1 + R_2} \right| \leq 1.0 \qquad (1)$$

$$8.0 \leq \frac{R_1^2}{3 \cdot d_2 \cdot f_s} \leq 25 \qquad (2)$$

$$0.3 \leq (N_{d2} - 1) \frac{d_2}{f_s} \leq 0.6 \qquad (3)$$

where, fs is the effective focal length of the optical lens, $R_1$ is the radius of curvature of the optical surface at the source side, $R_2$ is the radius of curvature of the optical surface at the project side, $d_2$ is the thickness of the optical lens at the central axis, and $N_{d2}$ is the refractive index of the optical lens.

Another objective of the present invention is alternate optical plastic and optical glass to enhance the productability or thermal stability.

A further objective of the present invention is to provide an LED assembly comprising an aspherical LED angular lens for narrow distribution patterns and an LED die, characterized in that the LED assembly includes a narrow angular circle distribution pattern greater than 15° and smaller than 30°, and a luminous flux ratio greater than 85% ($\beta/\alpha \geq 85\%$), and the LED assembly satisfies the following condition:

$$12 \le \frac{\omega - \varphi}{\pi} \cdot f_g < 36 \quad (4)$$

where, $$f_g = \left| \left( \frac{1}{R_1} - \frac{1}{R_2} \right) \cdot f_s \right| \quad (5)$$

where, $f_s$ is the effective focal length of the optical lens, $f_g$ is the relative focal length of the optical lens, $R_1$ is the radius of curvature of optical surface at the source side, $R_2$ is the radius of curvature of optical surface at the project side, $2\omega$ is the maximum angle of the light emitted from the LED die and symmetrical to the central axis, $2\varphi$ is the maximum angle of the light projected from the optical lens and symmetrical to the central axis, $\alpha$ is the luminous flux of light emitted from the LED die, and $\beta$ is the luminous flux of the light on the project side at a relative infinite distance ($100 \times f_s$) neglected the refraction and scattering in the air.

With the optical lens and the LED assembly composed of the optical lens according to the present invention, a narrow angular circle distribution pattern greater than 15° and smaller than 30° and a luminous flux ratio greater than 85% can be achieved to meet the requirements, and the optical lens comes with a simple shape, a thin thickness and an easy-to-manufacture feature, such that the optical lens can be applied in a single LED or an array of LEDs and used for illuminations or as a flash light for a cell phone or a camera.

DETAILED DESCRIPTION OF THE PREFERRED EMBODIMENTS

The present invention will become apparent in the following detailed description of the preferred embodiments with reference to the accompanying drawings.

Figure 1:
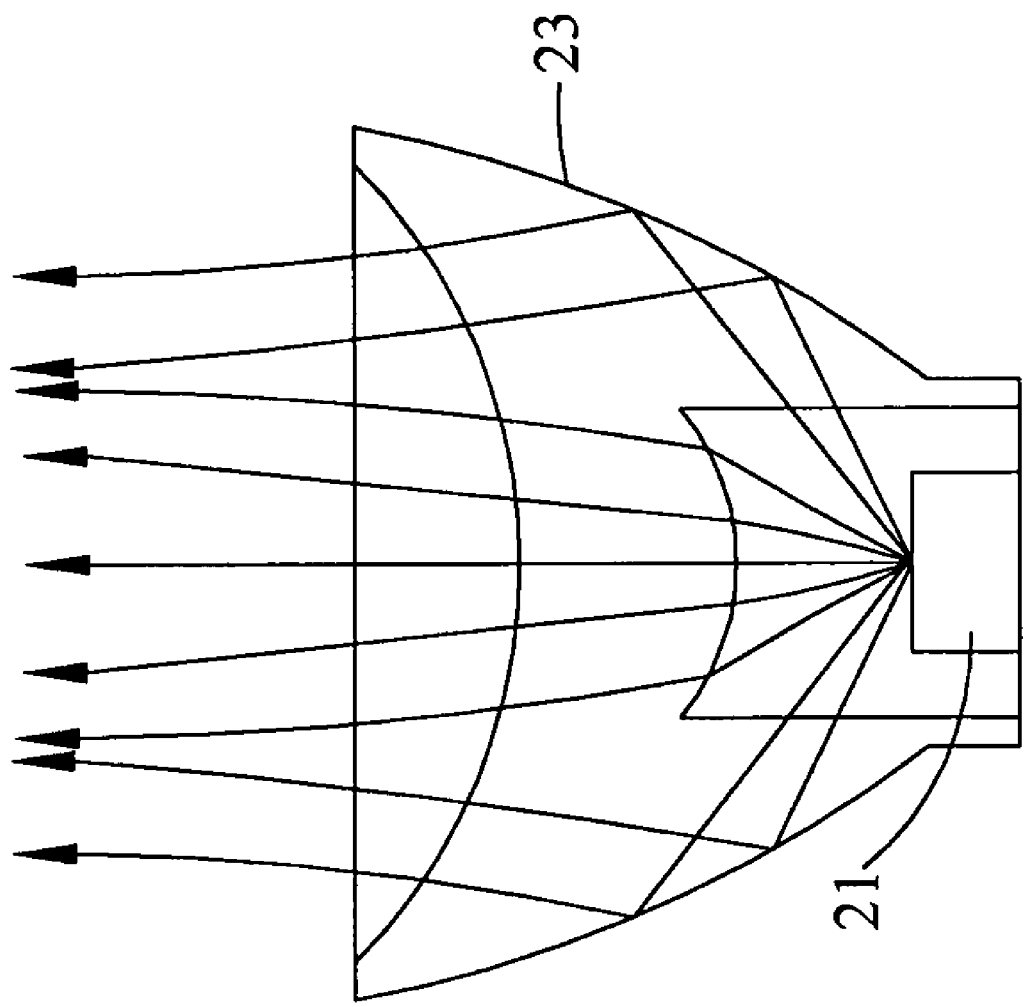
FIG. 1 is a schematic view of an LED assembly using an LED optical lens in accordance with a prior art.
Figure 2:
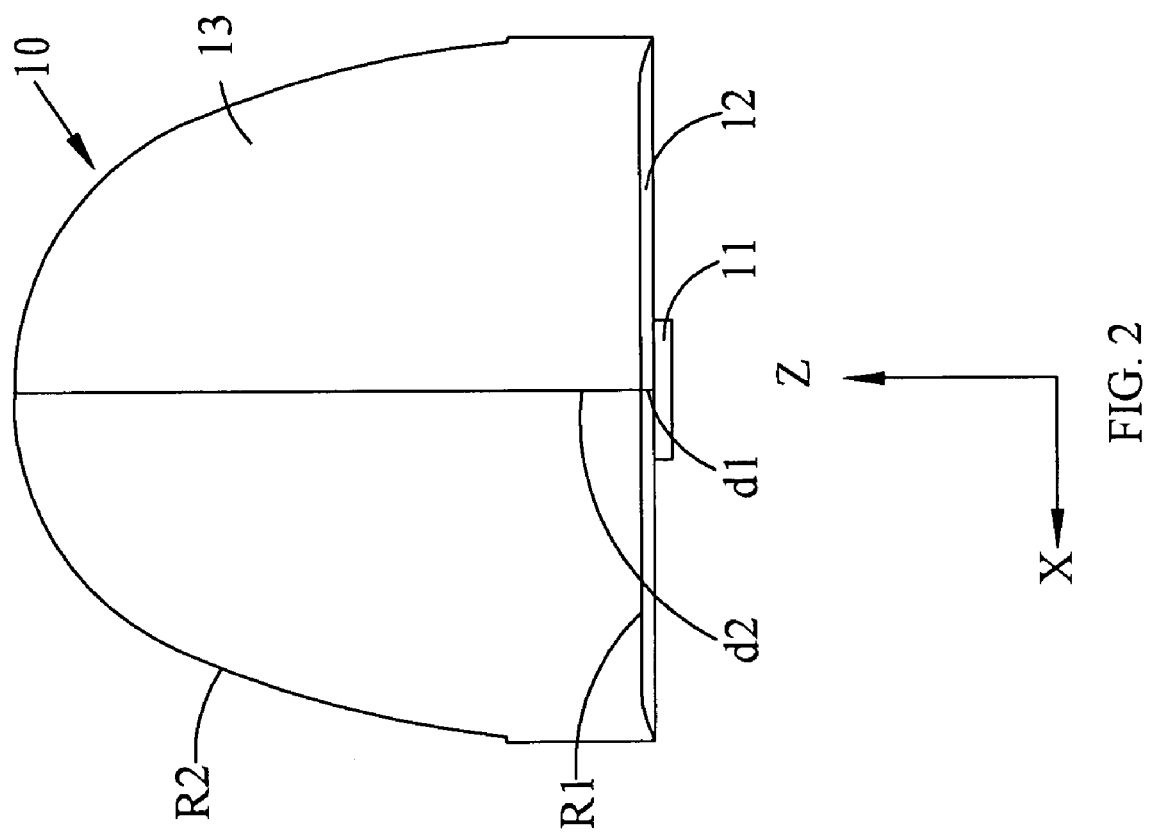
FIG. 2 is a schematic view of an LED assembly using an LED optical lens in accordance with the present invention.

With reference to FIG. 2 for a schematic view of an aspherical LED angular lens for narrow distribution patterns and an LED assembly using the lens in accordance with the present invention, an LED die 11, a seal gel 12 and an optical lens 13 are arranged sequentially along a central axis Z from a source side to a project side. After a light is emitted from the LED die 11 and passed through the seal gel 12, the optical lens 13 concentrates the light and forms a light beam with a narrow angular circle distribution pattern greater than 15° and smaller than 30° and symmetrical to the central axis Z and projects the light beam onto the project side. The optical lens 13 is a lens having a concave surface and a convex surface and made of an optical material, and the concave surface is optical surface $R_1$ facing the source side of the light source, and the convex surface is an optical surface $R_2$ facing the project side of the light source, and at least one optical surface is aspherical. The optical surfaces $R_1$, $R_2$ and the effective focal length of the optical lens 13 satisfy the conditions of Equations (1), (2) and (3), and an emitting angle $2\omega$ of the LED die 11 and an angle $2\varphi$ of the distribution pattern formed by the peak intensity of the optical lens 13 satisfy the condition of Equation (4).

The seal gel 12 used for the LED assembly includes but not limited to a common optical resin or a silicon gel.

If the optical surfaces $R_1$, $R_2$ of the optical lens 13 are aspherical optical surfaces, the aspherical surface formula is shown in Equation (6):

$$Z = \frac{ch^2}{1 + \sqrt{(1 - (1+K)c^2 h^2)}} + A_4 h^4 + A_6 h^6 + A_8 h^8 + A_{10} h^{10} \quad (6)$$

where, c is the curvature of the lens, h is the height of the lens, K is the conic constant of the lens, and $A_4$, $A_6$, $A_8$ and $A_{10}$ are the 4th, 6th, 8th and 10th order aspherical coefficients respectively.

Figure 3:
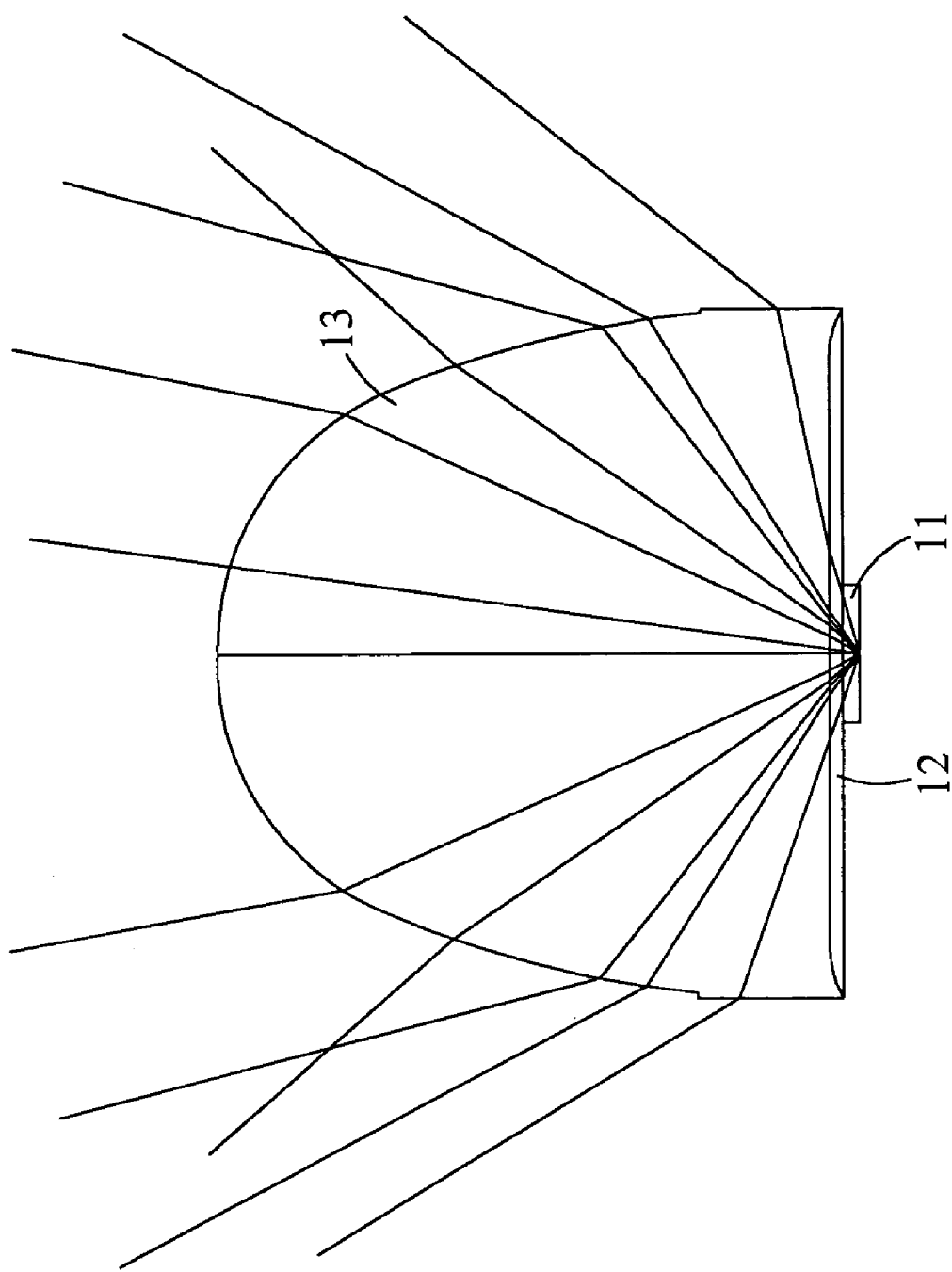
FIG. 3 is a schematic view of an optical path of an LED optical lens in accordance with the present invention.

With reference to FIG. 3 for a schematic view of an optical path of the present invention, the maximum angle of light emitted from the LED die 11 is equal to $2\omega$ (symmetrical to the central axis Z), and the light is concentrated and refracted by the optical lens 13 to form a required distribution pattern by the angle $2\varphi$ (symmetrical to the central axis Z) and satisfy the requirement $\beta/\alpha \geq 70\%$, where $\alpha$ is the luminous flux of the light emitted from the LED die, and $\beta$ is the luminous flux of the project side of the LED assembly at a relative infinite distance ($100 \times f_s$) neglected the refraction and scattering in the air, provided that the refraction and scattering effects of the air are neglected, and the optical lens 13 is made of optical glass or optical plastic.

With the structure described above, the LED assembly composed of an aspherical LED angular lens for narrow distribution patterns complies with a narrow angular circle distribution pattern greater than 15° and smaller than 30°, such that the LED assembly 10 can emit a predetermined pattern and comply with the requirement of a luminous flux ratio greater than 85% ($\beta/\alpha \geqq 85\%$), and a single LED assembly or an array of LED assemblies for different distribution patterns can be used.

In the embodiments of the present invention, a 1.0 mm×1.0 mm die is used for illustrating the LED die 11, and an optical lens 13 with a diameter of 5 mm is used for illustrating each embodiment, but the size of the LED die 11 and the diameter of the optical lens 13 are not limited to the aforementioned dimensions.

Embodiment 1

Figure 4:
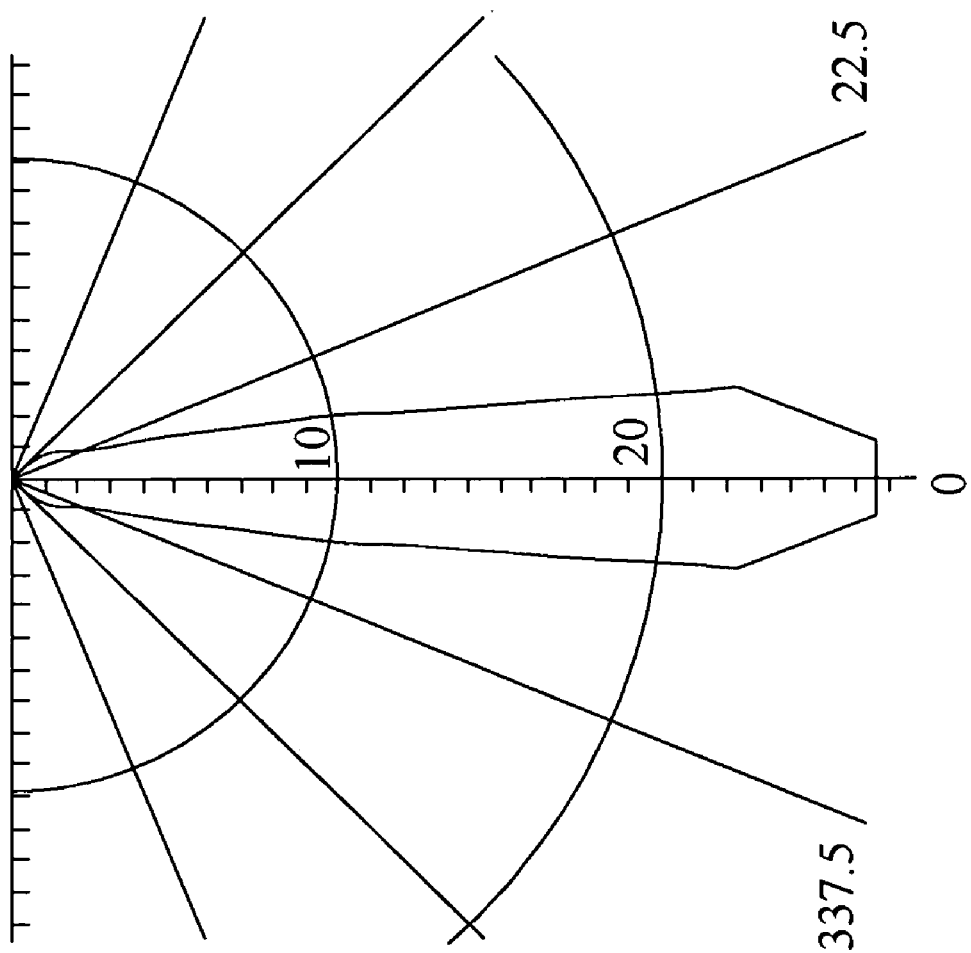
FIG. 4 is a schematic view of polar coordinates of a peak intensity distribution and an illumination angle of an LED assembly in accordance with a first preferred embodiment of the present invention.

Refer to FIGS. 2 and 4 for a schematic view of an LED assembly using an optical lens and a schematic view of polar coordinates of a peak intensity distribution and an illumination angle of an LED assembly in accordance with a first preferred embodiment of the present invention respectively.

In Table (1), the LED die 11, the seal gel 12 and the optical lens 13 are arranged from the source side to the project side along the central axis Z, wherein the radius of curvature R (unit: mm) of the optical lens 13 at the optical surface $R_1$ of the source side, the radius of curvature R (unit: mm) of the optical lens 13 at the optical surface $R_2$ of the project side, and the distance d (which is the on-axis surface spacing) (unit: mm) are shown, and the maximum angle of the light emitted from the LED die 11 is equal to $2\omega$ (unit: degree), and the maximum angle of the light with the distribution pattern projected from the optical lens 13 is equal to $2\phi$ (unit: degree), and each refractive index ($N_d$), each Abbe's number ($v_d$), and each thickness are shown.

TABLE (1)

$2\omega = 80\ 2\phi = 22$

| No | Optical Surface | Radius of Curvature | Thickness | Nd | Vd |
|---|---|---|---|---|---|
| 0 | Light source | | 0.1000 | | |
| 1 | Silicon Gel | | 0.07100 | 1.5270 | 34 |
| 2 | R1 | 20.0 | 4.3102 | 1.5828 | 61.7 |
| *3 | R2 | 392.8443 | ∞ | | |
| 4 | Project side | | | | |

*Aspherical Surface

In Table (1), the optical surface (Surf) marked with * indicates an aspherical optical surface. In Table (2), coefficients of aspherical Equation (6) for each optical surface are given:

TABLE (2)

| | K | A4 | A6 | A8 | A10 |
|---|---|---|---|---|---|
| *R2 | −5.3268E−01 | 3.4785E−02 | −1.3739E−03 | 1.4512E−03 | −1.0582E−04 |

In this preferred embodiment, a seal gel 12 is filled with a transparent optical silicon gel with the refractive index $N_{d1}$ equal to 1.527 and the Abbe's number $v_{d1}$ equal to 34, and the optical lens 13 is made of a glass material with the refractive index $N_{d2}$ equal to 1.5828, and the Abbe's number $v_{d2}$ equal to 61.7. With the refractive coefficients and Abbe's numbers of the seal gel 12 and the optical lens 13, a light refractive angle is defined. The LED die 11 emits a blue light with $\alpha=9.305$ lumen, and the effective maximum angle=80°, and the effective focal length $f_s$ of the optical lens 13 equal to 5.408 mm. The blue light concentrated by the optical lens 13, and projected with a narrow illumination angle of 22° at a relative infinite distance (which is calculated by $100 \times f_s$) and $\beta=7.940$ lumen (neglecting the refraction and scattering effect of the air ). Equations (1) to (5) are given below:

$$\left|\frac{R_1 - R_2}{R_1 + R_2}\right| = 0.8176$$

$$\frac{R_1^2}{3 \cdot d_2 \cdot f_s} = 12.8698$$

$$(N_{d2} - 1)\frac{d_2}{f_s} = 0.4645$$

$$f_g = \left|\left(\frac{1}{R_1} - \frac{1}{R_2}\right) \cdot f_s\right| = 1.6160$$

$$\frac{\omega - \varphi}{\pi} \cdot f_g = 14.9176$$

$$\beta/\alpha = 85.33\%$$

Equations (1) to (5) can be satisfied. FIG. 3 shows the optical path of a light emitted from the LED die 11 and passed through the seal gel 12 and the optical lens 13, and FIG. 4 shows the polar coordinates of a peak intensity distribution and an illumination angle. Tables (1) and (2) and FIG. 4 show that the aspherical LED angular lens for narrow distribution patterns has a simple shape, and an easy-to-manufacture feature, and the LED assembly has a predetermined pattern, and an uniform peak intensity for each angle, so as to enhance the applicability of the present invention.

Embodiment 2

Figure 5:
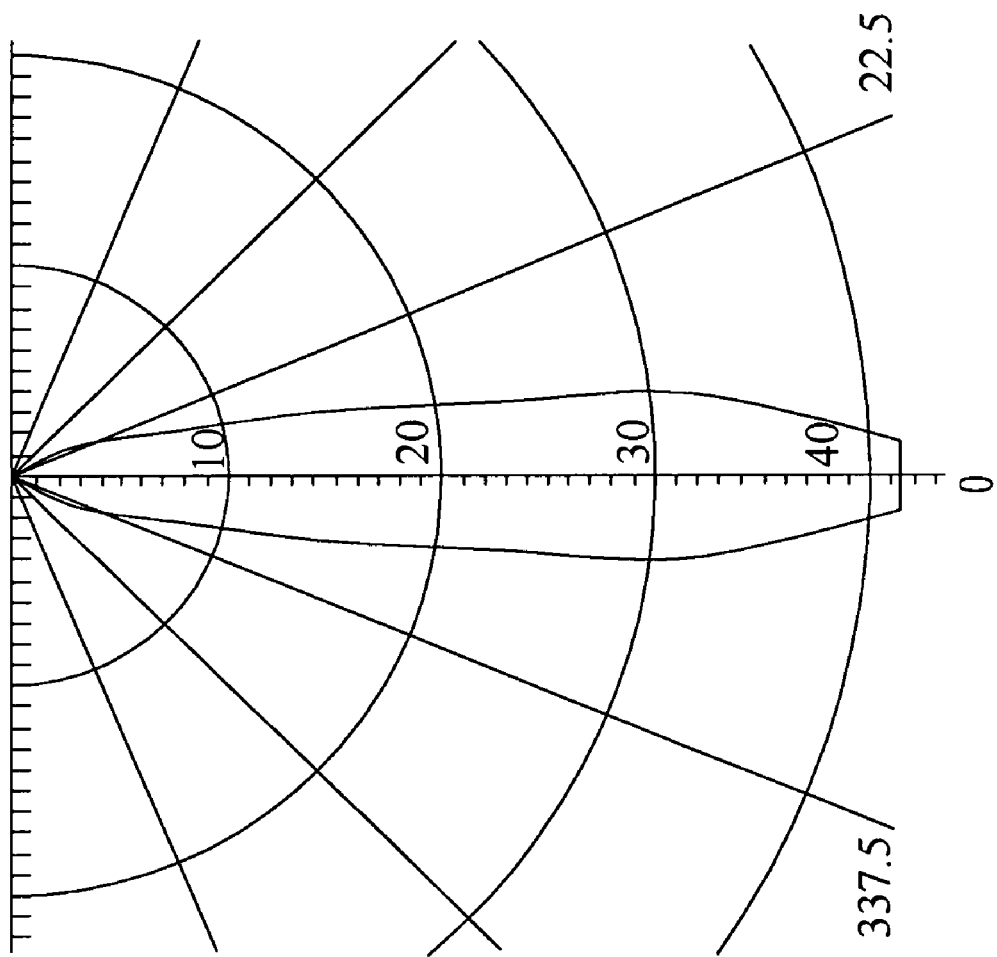
FIG. 5 is a schematic view of polar coordinates of a peak intensity distribution and an illumination angle of an LED assembly in accordance with a second preferred embodiment of the present invention.

Refer to FIGS. 2 and 5 for schematic views of an LED assembly using an optical lens and polar coordinates of a peak intensity distribution and an illumination angle in accordance with a second preferred embodiment of the present invention.

In Table (3), the LED die 11, the seal gel 12 and the optical lens 13 are arranged from the source side to the project side along the central axis Z, wherein the radius of curvature R (unit: mm) of the optical lens 13 at the optical surface $R_1$ of the source side, the radius of curvature R (unit: mm) of the optical lens 13 at the optical surface $R_2$ of the project side, and the distance d (which is the on-axis surface spacing) (unit: mm) are shown, and the maximum angle of the light emitted from the LED die 11 is equal to $2\omega$ (unit: degree), and the maximum angle of the light with the distribution pattern projected from the optical lens 13 is equal to $2\phi$ (unit: degree), and each refractive index ($N_d$), each Abbe's number ($v_d$), and each thickness are shown.

TABLE (3)

$2\omega = 120\ 2\phi = 20$

| No | Optical Surface | Radius of Curvature | Thickness | Nd | Vd |
|---|---|---|---|---|---|
| 0 | Light source | | 0.1000 | | |
| 1 | Silicon Gel | | 0.6600 | 1.5270 | 34 |
| *2 | R1 | 41.3 | 4.4183 | 1.5828 | 61.7 |
| *3 | R2 | 3.3 | ∞ | | |
| 4 | Project side | | | | |

*Aspherical Surface

TABLE (4)

| | K | A4 | A6 | A8 | A10 |
|---|---|---|---|---|---|
| *R1 | −6.9621E+01 | −9.9641E−04 | −2.8023E−04 | 3.7144E−08 | −1.9359E−06 |
| *R2 | −1.1391E−01 | 3.6330E−02 | −1.0450E−03 | 1.4773E−03 | −1.1156E−04 |

In this preferred embodiment, a seal gel 12 is filled with a transparent optical silicon gel with the refractive index $N_{d1}$ equal to 1.527 and the Abbe's number $v_{d1}$ equal to 34, and the optical lens 13 is made of a glass material with the refractive index $N_{d2}$ equal to 1.5828, and the Abbe's number $v_{d2}$ equal to 61.7. With the refractive coefficients and Abbe's numbers of the seal gel 12 and the optical lens 13, a light refractive angle is defined. The LED die 11 emits a blue light with α=13.958 lumen, and the effective maximum angle=120°, and the effective focal length $f_s$ of the optical lens 13 equal to 5.439 mm. The blue light concentrated by the optical lens 13, and projected with a narrow illumination angle of 20° at a relative infinite distance (which is calculated by 100×$f_s$) and β=12.262 lumen (neglecting the refraction and scattering effect of the air ). Equations (1) to (5) are given below:

$$\left|\frac{R_1 - R_2}{R_1 + R_2}\right| = 0.8516$$

$$\frac{R_1^2}{3 \cdot d_2 \cdot f_s} = 23.6156$$

$$(N_{d2} - 1)\frac{d_2}{f_s} = 0.4734$$

the distance d (which is the on-axis surface spacing) (unit: mm) are shown, and the maximum angle of the light emitted from the LED die 11 is equal to 2ω (unit: degree), and the maximum angle of the light with the distribution pattern projected from the optical lens 13 is equal to 2φ (unit: degree), and each refractive index ($N_d$), each Abbe's number ($v_d$), and each thickness are shown. Table (6) shows coefficients of aspherical equation (6) of each optical surface.

TABLE (5)

2ω = 120 2φ = 20

| No | Optical Surface | Radius of Curvature | Thickness | Nd | Vd |
|---|---|---|---|---|---|
| 0 | Light source | | 0.1000 | | |
| 1 | Silicon Gel | | 0.7100 | 1.5270 | 34 |
| 2 | R1 | 30.0 | 4.3102 | 1.5828 | 61.7 |
| *3 | R2 | 3.0 | ∞ | | |
| 4 | Project side | | | | |

*Aspherical Surface

TABLE (6)

| | K | A4 | A6 | A8 | A10 |
|---|---|---|---|---|---|
| *R2 | −5.3268E−01 | 3.4785E−02 | −1.3739E−03 | 1.4512E−03 | −1.0582E−04 |

-continued $$f_g = \left|\left(\frac{1}{R_1} - \frac{1}{R_2}\right) \cdot f_s\right| = 1.5125$$

$$\frac{\omega - \varphi}{\pi} \cdot f_g = 24.07$$

$$\beta/\alpha = 87.85\%$$

Equations (1) to (5) can be satisfied. Tables (3) and (4) and FIG. 5 show that the aspherical LED angular lens for narrow distribution patterns has a simple shape, and an easy-to-manufacture feature, and the LED assembly has a predetermined pattern, and an uniform peak intensity for each angle, so as to enhance the applicability of the present invention.

Embodiment 3

Figure 6:
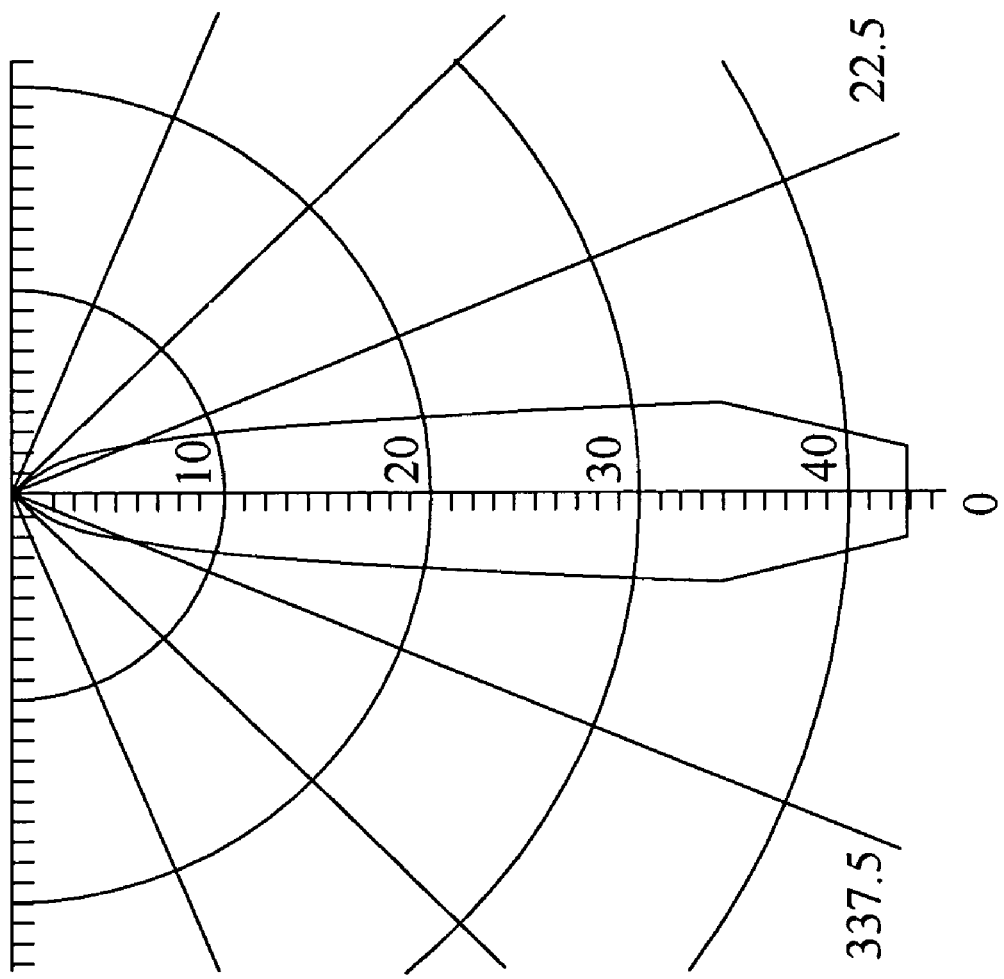
FIG. 6 is a schematic view of polar coordinates of a peak intensity distribution and an illumination angle of an LED assembly in accordance with a third preferred embodiment of the present invention.

Refer to FIGS. 2 and 6 for schematic views of an LED assembly using an optical lens and polar coordinates of a peak intensity distribution and an illumination angle in accordance with a third preferred embodiment of the present invention.

In Table (5), the LED die 11, the seal gel 12 and the optical lens 13 are arranged from the source side to the project side along the central axis Z, wherein the radius of curvature R (unit: mm) of the optical lens 13 at the optical surface $R_1$ of the source side, the radius of curvature R (unit: mm) of the optical lens 13 at the optical surface $R_2$ of the project side, and In this preferred embodiment, a seal gel 12 is filled with a transparent optical silicon gel with the refractive index $N_{d1}$ equal to 1.527 and the Abbe's number $v_{d1}$ equal to 34, and the optical lens 13 is made of a glass material with the refractive index $N_{d2}$ equal to 1.5828, and the Abbe's number $v_{d2}$ equal to 61.7. With the refractive coefficients and Abbe's numbers of the seal gel 12 and the optical lens 13, a light refractive angle is defined. The LED die 11 emits a blue light with α=13.958 lumen, and the effective maximum angle=120°, and the effective focal length $f_s$ of the optical lens 13 equal to 5.408 mm. The blue light concentrated by the optical lens 13, and projected with a narrow illumination angle of 20° at a relative infinite distance (which is calculated by 100×$f_s$) and β=12.578 lumen (neglecting the refraction and scattering effect of the air). Equations (1) to (5) are given below:

$$\left|\frac{R_1 - R_2}{R_1 + R_2}\right| = 0.8176$$

$$\frac{R_1^2}{3 \cdot d_2 \cdot f_s} = 12.8698$$

$$(N_{d2} - 1)\frac{d_2}{f_s} = 0.4645$$

$$f_g = \left|\left(\frac{1}{R_1} - \frac{1}{R_2}\right) \cdot f_s\right| = 1.6160$$

-continued $$\frac{\omega - \varphi}{\pi} \cdot f_g = 25.72$$

$$\beta/\alpha = 90.11\%$$

Equations (1) to (5) can be satisfied. Tables (5) and (6) and FIG. 6 show that the aspherical LED angular lens for narrow distribution patterns has a simple shape, and an easy-to-manufacture feature, and the LED assembly has a predetermined pattern, and an uniform peak intensity for each angle, so as to enhance the applicability of the present invention.

Embodiment 4

Figure 7:
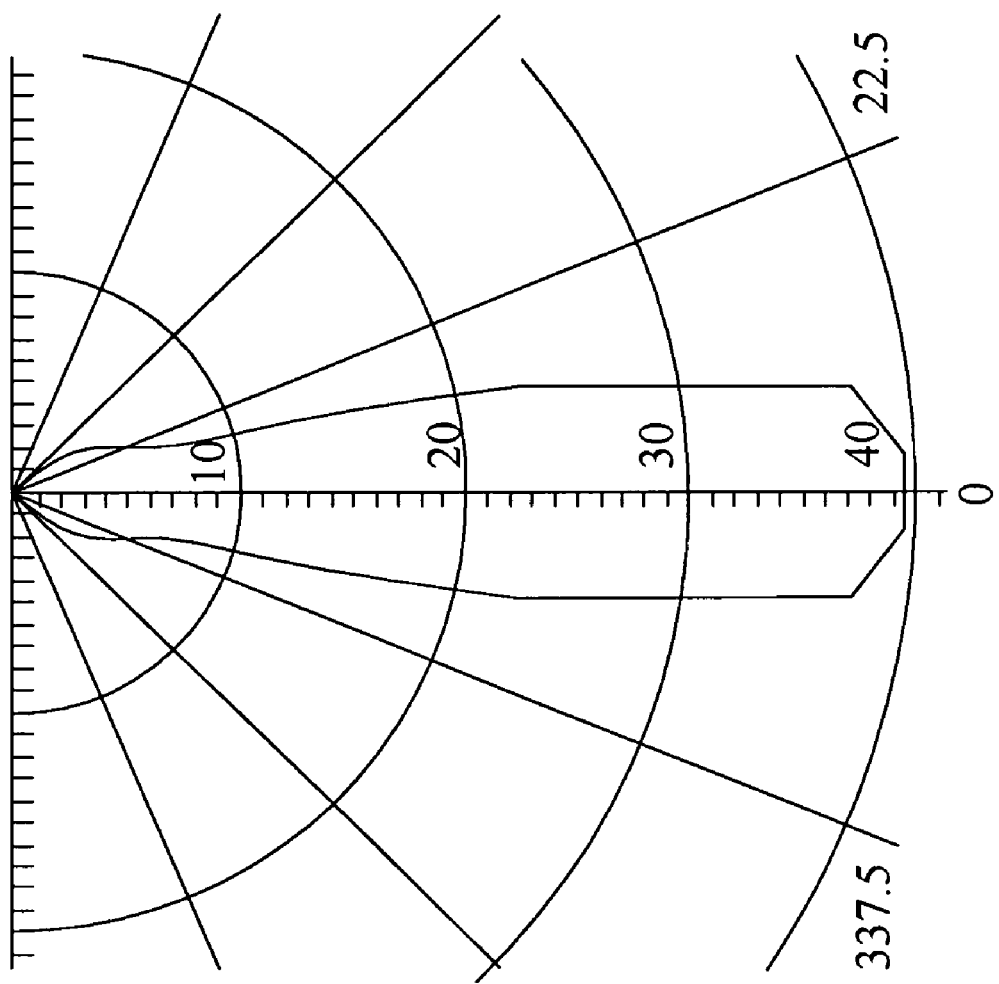
FIG. 7 is a schematic view of polar coordinates of a peak intensity distribution and an illumination angle of an LED assembly in accordance with a fourth preferred embodiment of the present invention.

Refer to FIGS. 2 and 7 for schematic views of an LED assembly using an optical lens and polar coordinates of a peak intensity distribution and an illumination angle in accordance with a fourth preferred embodiment of the present invention.

In Table (7), the LED die 11, the seal gel 12 and the optical lens 13 are arranged from the source side to the project side along the central axis Z, wherein the radius of curvature R (unit: mm) of the optical lens 13 at the optical surface $R_1$ of the source side, the radius of curvature R (unit: mm) of the optical lens 13 at the optical surface $R_2$ of the project side, and the distance d (which is the on-axis surface spacing) (unit: mm) are shown, and the maximum angle of the light emitted from the LED die 11 is equal to $2\omega$ (unit: degree), and the maximum angle of the light with the distribution pattern projected from the optical lens 13 is equal to $2\phi$ (unit: degree), and each refractive index ($N_d$), each Abbe's number ($v_d$), and each thickness are shown. Table (8) shows coefficients of aspherical Equation (6) for each optical surface.

TABLE (7)

$2\omega = 120 \ 2\phi = 29$

| No | Optical Surface | Radius of Curvature | Thickness | Nd | Vd |
|---|---|---|---|---|---|
| 0 | Light source | | 0.1000 | | |
| 1 | Silicon Gel | | 0.7500 | 1.5270 | 34 |
| 2 | R1 | 25.0 | 3.9000 | 1.5828 | 61.7 |
| *3 | R2 | 3.2 | ∞ | | |
| 4 | Project side | | | | |

*Aspherical Surface

TABLE (8)

| K | A4 | A6 | A8 | A10 |
|---|---|---|---|---|
| *R2 −8.2758E−01 | 4.4555E−02 | −2.8102E−03 | 1.1324E−03 | −1.2662E−04 |

In this preferred embodiment, a seal gel 12 is filled with a transparent optical silicon gel with the refractive index $N_{d1}$ equal to 1.527 and the Abbe's number $v_{d1}$ equal to 34, and the optical lens 13 is made of a glass material with the refractive index $N_{d2}$ equal to 1.5828, and the Abbe's number $v_{d2}$ equal to 61.7. With the refractive coefficients and Abbe's numbers of the seal gel 12 and the optical lens 13, a light refractive angle is defined. The LED die 11 emits a blue light with $\alpha$=13.958 lumen, and the effective maximum angle=120°, and the effective focal length $f_s$ of the optical lens 13 equal to 5.963 mm. The blue light concentrated by the optical lens 13, and projected with a narrow illumination angle of 29° at a relative infinite distance (which is calculated by 100×$f_s$) and $\beta$=12.343 lumen (neglecting the refraction and scattering effect of the air ). Equations (1) to (5) are given below:

$$\left|\frac{R_1 - R_2}{R_1 + R_2}\right| = 0.7709$$

$$\frac{R_1^2}{3 \cdot d_2 \cdot f_s} = 8.9588$$

$$(N_{d2} - 1)\frac{d_2}{f_s} = 0.3812$$

$$f_g = \left|\left(\frac{1}{R_1} - \frac{1}{R_2}\right) \cdot f_s\right| = 1.6051$$

$$\frac{\omega - \varphi}{\pi} \cdot f_g = 23.2474$$

$$\beta/\alpha = 88.43\%$$

Equations (1) to (5) can be satisfied. Tables (7) and (8) and FIG. 7 show that the aspherical LED angular lens for narrow distribution patterns has a simple shape, and an easy-to-manufacture feature, and the LED assembly has a predetermined pattern, and an uniform peak intensity for each angle, so as to enhance the applicability of the present invention.

Embodiment 5

Figure 8:
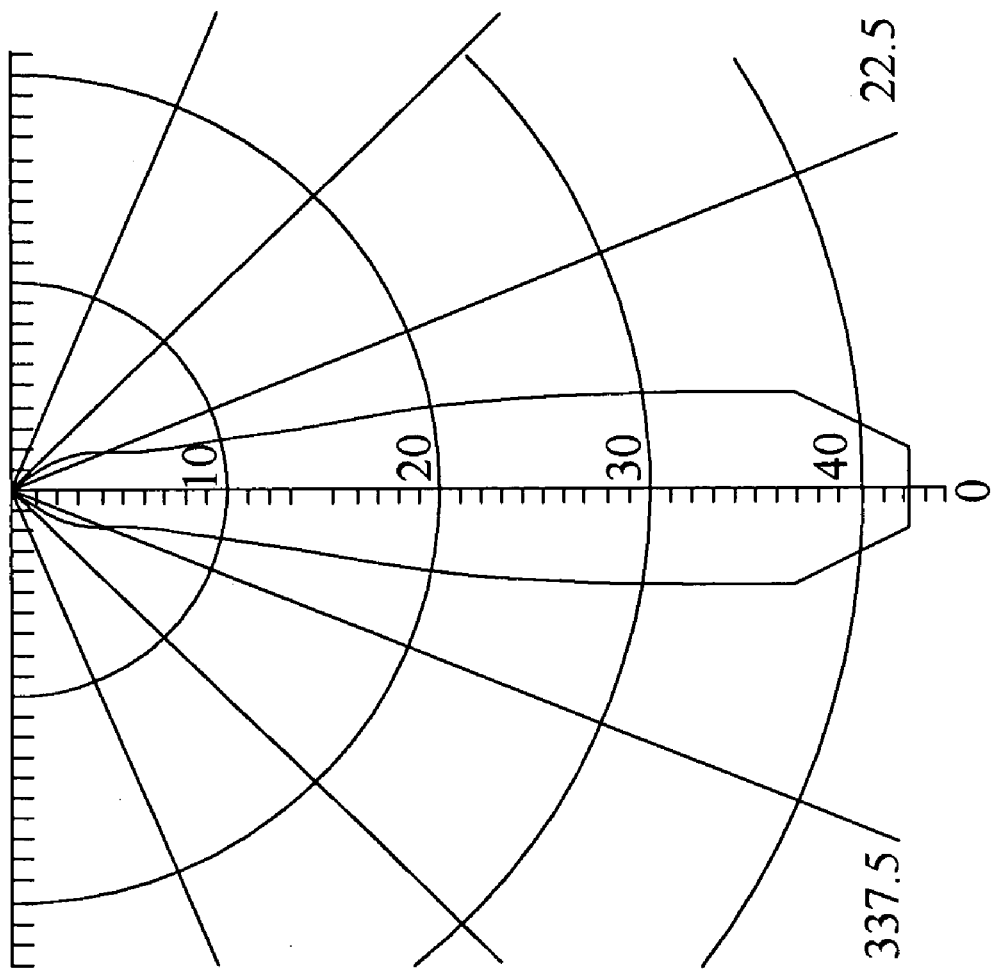
FIG. 8 is a schematic view of polar coordinates of a peak intensity distribution and an illumination angle of an LED assembly in accordance with a fifth preferred embodiment of the present invention.

Refer to FIGS. 2 and 8 for schematic views of an LED assembly using an optical lens and polar coordinates of a peak intensity distribution and an illumination angle in accordance with a fifth preferred embodiment of the present invention.

In Table (9), the LED die 11, the seal gel 12 and the optical lens 13 are arranged from the source side to the project side along the central axis Z, wherein the radius of curvature R (unit: mm) of the optical lens 13 at the optical surface $R_1$ of the source side, the radius of curvature R (unit: mm) of the optical lens 13 at the optical surface $R_2$ of the project side, and the distance d (which is the on-axis surface spacing) (unit: mm) are shown, and the maximum angle of the light emitted from the LED die 11 is equal to $2\omega$ (unit: degree), and the maximum angle of the light with the distribution pattern projected from the optical lens 13 is equal to $2\phi$ (unit: degree), and each refractive index ($N_d$), each Abbe's number ($v_d$), and each thickness are shown. Table (10) shows coefficients of aspherical Equation (6) of each optical surface.

TABLE (9)

$2\omega = 120 \ 2\phi = 24$

| No | Optical Surface | Radius of Curvature | Thickness | Nd | Vd |
|---|---|---|---|---|---|
| 0 | Light source | | 0.1000 | | |
| 1 | Silicon Gel | | 0.7100 | 1.5270 | 34 |
| 2 | R1 | 30.0 | 4.3102 | 1.5300 | 57 |
| *3 | R2 | 3.0 | ∞ | | |
| 4 | Project side | | | | |

*Aspherical Surface

TABLE (10)

| | K | A4 | A6 | A8 | A10 |
|---|---|---|---|---|---|
| *R2 | −5.3268E−01 | 3.4785E−02 | −1.3739E−03 | 1.4512E−03 | −1.0582E−04 |

In this preferred embodiment, a seal gel 12 is filled with a transparent optical silicon gel with the refractive index $N_{d1}$ equal to 1.527 and the Abbe's number $v_{d1}$ equal to 34, and the optical lens 13 is made of a plastic material with the refractive index $N_{d2}$ equal to 1.530, and the Abbe's number $v_{d2}$ equal to 57. With the refractive coefficients and Abbe's numbers of the seal gel 12 and the optical lens 13, a light refractive angle is defined. The LED die 11 emits a blue light with α=13.958 lumen, and the effective maximum angle=120°, and the effective focal length $f_s$ of the optical lens 13 equal to 5.408 mm. The blue light concentrated by the optical lens 13, and projected with a narrow illumination angle of 24° at a relative infinite distance (which is calculated by 100×$f_s$) and β=12.133 lumen (neglecting the refraction and scattering effect of the air ). Equations (1) to (5) are given below:

$$\left|\frac{R_1 - R_2}{R_1 + R_2}\right| = 0.8176$$

$$\frac{R_1^2}{3 \cdot d_2 \cdot f_s} = 12.8698$$

$$(N_{d2} - 1)\frac{d_2}{f_s} = 0.4224$$

mm) are shown, and the maximum angle of the light emitted from the LED die 11 is equal to 2ω (unit: degree), and the maximum angle of the light with the distribution pattern projected from the optical lens 13 is equal to 2φ (unit: degree), and each refractive index ($N_d$), each Abbe's number ($v_d$), and each thickness are shown. Table (12) shows coefficients of aspherical Equation (6) for each optical surface.

TABLE (11)

| | 2ω = 150 2φ = 24 | | | | |
|---|---|---|---|---|---|
| No | Optical Surface | Radius of Curvature | Thickness | Nd | Vd |
| 0 | Light source | | 0.1000 | | |
| 1 | Silicon Gel | | 0.7100 | 1.5270 | 34 |
| 2 | R1 | 30.0 | 4.3102 | 1.5828 | 61.7 |
| *3 | R2 | 3.0 | ∞ | | |
| 4 | Project side | | | | |

*Aspherical Surface

TABLE (12)

| | K | A4 | A6 | A8 | A10 |
|---|---|---|---|---|---|
| *R2 | −5.3268E−01 | 3.4785E−02 | −1.3739E−03 | 1.4512E−03 | −1.0582E−04 |

-continued $$f_g = \left|\left(\frac{1}{R_1} - \frac{1}{R_2}\right) \cdot f_s\right| = 1.6161$$

$$\frac{\omega - \varphi}{\pi} \cdot f_g = 24.6912$$

$$\beta/\alpha = 86.92\%$$

Equations (1) to (5) can be satisfied. Tables (9) and (10) and FIG. 8 show that the aspherical LED angular lens for narrow distribution patterns has a simple shape, and an easy-to-manufacture feature, and the LED assembly has a predetermined pattern, and an uniform peak intensity for each angle, so as to enhance the applicability of the present invention.

Embodiment 6

Figure 9:
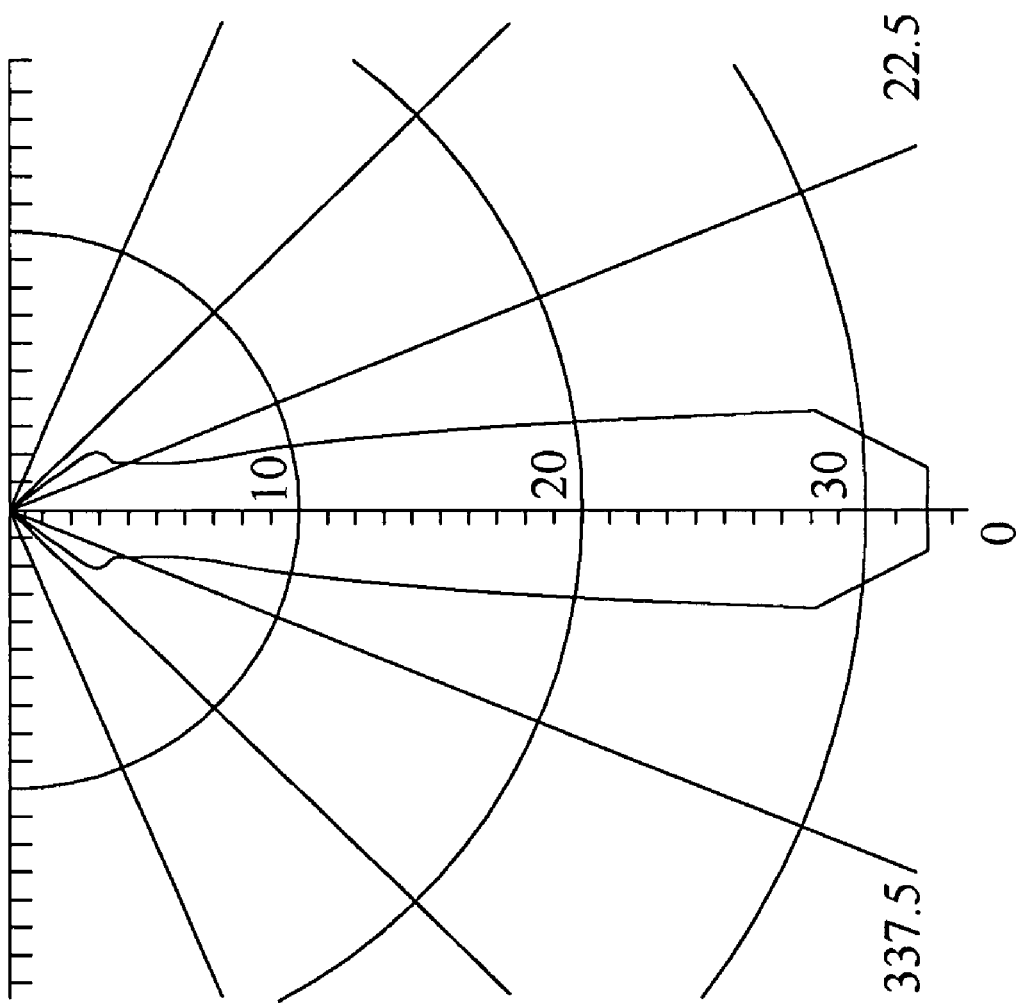
FIG. 9 is a schematic view of polar coordinates of a peak intensity distribution and an illumination angle of an LED assembly in accordance with a sixth preferred embodiment of the present invention.

Refer to FIGS. 2 and 9 for schematic views of an LED assembly using an optical lens and polar coordinates of a peak intensity distribution and an illumination angle in accordance with a sixth preferred embodiment of the present invention.

In Table (11), the LED die 11, the seal gel 12 and the optical lens 13 are arranged from the source side to the project side along the central axis Z, wherein the radius of curvature R (unit: mm) of the optical lens 13 at the optical surface $R_1$ of the source side, the radius of curvature R (unit: mm) of the optical lens 13 at the optical surface $R_2$ of the project side, and the distance d (which is the on-axis surface spacing) (unit:

In this preferred embodiment, a seal gel 12 is filled with a transparent optical silicon gel with the refractive index $N_{d1}$ equal to 1.527 and the Abbe's number $v_{d1}$ equal to 34, and the optical lens 13 is made of a glass material with the refractive index $N_{d2}$ equal to 1.5828, and the Abbe's number $v_{d2}$ equal to 61.7. With the refractive coefficients and Abbe's numbers of the seal gel 12 and the optical lens 13, a light refractive angle is defined. The LED die 11 emits a blue light with α=13.958 lumen, and the effective maximum angle=150°, and the effective focal length fs of the optical lens 13 equal to 5.408 mm. The blue light concentrated by the optical lens 13, and projected with a narrow illumination angle of 24° at a relative infinite distance (which is calculated by 100×fs) and β=13.481 lumen (neglecting the refraction and scattering effect of the air ). Equations (1) to (5) are given below:

$$\left|\frac{R_1 - R_2}{R_1 + R_2}\right| = 0.8176$$

$$\frac{R_1^2}{3 \cdot d_2 \cdot f_s} = 12.8698$$

$$(N_{d2} - 1)\frac{d_2}{f_s} = 0.4665$$

$$f_g = \left|\left(\frac{1}{R_1} - \frac{1}{R_2}\right) \cdot f_s\right| = 1.6161$$

-continued $$\frac{\omega-\varphi}{\pi}\cdot f_g = 32.40$$

$$\beta/\alpha = 96.58\%$$

Equations (1) to (5) can be satisfied. Tables (11) and (12) and FIG. 9 show that the aspherical LED angular lens for narrow distribution patterns has a simple shape, and an easy-to-manufacture feature, and the LED assembly has a predetermined pattern, and an uniform peak intensity for each angle, so as to enhance the applicability of the present invention.

In summation of the description above, the aspherical LED angular lens for narrow distribution patterns and the LED assembly in accordance with the present invention has a simple shape, and uses plastic injection molding or glass molding process for their mass production, and thus they will not be deformed easily, so as to reduce the production cost.

Another effect of the aspherical LED angular lens for narrow distribution patterns and its LED assembly in accordance with the present invention resides on that the light source projected from the LED die has a predetermined distribution pattern applicable for specific illumination conditions for illuminations and flash lights of cell phones or cameras.

A further effect of the aspherical LED angular lens for narrow distribution patterns and its LED assembly in accordance with the present invention resides on that the light source projected from the LED die maintains an uniform illumination intensity, so that no portion of the project is be too bright or too dark, and the illumination quality is improved.

What is claimed is:

1. An aspherical LED angular lens for narrow distribution patterns, applied in an LED assembly, having an LED die, a seal gel and an optical lens arranged along a central axis from a source side to a project side, in which:

the optical lens is a lens having a concave surface and a convex surface, and the concave surface is an optical surface facing the source side of the LED die, and the convex surface is an optical surface facing the project side of the LED die, and at least one of the optical surfaces is aspherical; and the optical lens satisfies the condition of:

$$0.7 \le \left|\frac{R_1-R_2}{R_1+R_2}\right| \le 1.0$$

where, $R_1$ is the radius of curvature of the optical lens at the optical surface of the source side, and $R_2$ is the radius of curvature of the optical lens at the optical surface of the project side, and wherein the optical lens satisfies the condition of:

$$0.3 \le (N_{d2}-1)\frac{d_2}{f_s} \le 0.6$$

where, $f_s$ is the effective focal length of the optical lens, $d_2$ is the thickness of the optical lens on the central axis, and $N_{d2}$ is the refractive index of the optical lens.

2. The aspherical LED angular lens for narrow distribution patterns of claim 1, wherein the optical lens satisfies the condition of:

$$8.0 \le \frac{R_1^2}{3\cdot d_2 \cdot f_s} \le 25$$

where, fs is the effective focal length of the optical lens, $R_1$ is the radius of curvature of the optical lens at an optical surface of a source side, and $d_2$ is the thickness of the optical lens on the central axis.

3. The aspherical LED angular lens for narrow distribution patterns of claim 1, wherein the optical lens is made of a plastic material.

4. The aspherical LED angular lens for narrow distribution patterns of claim 1, wherein the optical lens is made of a glass optical material.

5. An LED assembly, comprising an aspherical LED angular lens for narrow distribution patterns as recited in claim 1, in which the LED assembly comprises a narrow angular circle distribution pattern greater than 120° and smaller than 180° and satisfies the condition of:

$$12 \le \frac{\omega-\varphi}{\pi}\cdot f_g < 36$$

where, $$f_g = \left|\left(\frac{1}{R_1}-\frac{1}{R_2}\right)\cdot f_s\right|$$

where $f_g$ is the relative focal length of the optical lens, fs is the effective focal length of the optical lens, $R_1$ is the radius of curvature of the optical lens at an optical surface of a source side, $R_2$ is the radius of curvature of the optical lens at an optical surface of an project side, ω is half of the maximum angle of a light emitted symmetrically from the central axis by the LED die, and φ is half of the maximum angle of a light symmetrically projected from the central axis by the optical lens.

6. The LED assembly of claim 5, wherein the LED assembly has a luminous flux ratio of a luminous flux of the emitted light and a luminous flux of an project side at a relative infinite distance, and the luminous flux ratio satisfies the condition of:

$$\beta/\alpha \ge 85\%$$

where, α is the luminous flux of the light emitted from the LED die, and β is the luminous flux of the project side of the LED assembly at a relative infinite distance, provided that the refraction and scattering effects of the air are neglected.

* * * * *